(12) United States Patent
Nah et al.

(10) Patent No.: US 11,289,259 B2
(45) Date of Patent: Mar. 29, 2022

(54) MAGNETIC CORE, INDUCTOR, AND EMI FILTER COMPRISING SAME

(71) Applicant: LG INNOTEK CO., LTD., Seoul (KR)

(72) Inventors: Hyun Min Nah, Seoul (KR); Taek Hoon Nam, Seoul (KR); Sung San Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 91 days.

(21) Appl. No.: 16/954,606

(22) PCT Filed: Dec. 20, 2018

(86) PCT No.: PCT/KR2018/016326
§ 371 (c)(1),
(2) Date: Jun. 17, 2020

(87) PCT Pub. No.: WO2019/132413
PCT Pub. Date: Jul. 4, 2019

(65) Prior Publication Data
US 2020/0312515 A1 Oct. 1, 2020

(30) Foreign Application Priority Data
Dec. 29, 2017 (KR) .................. 10-2017-0183905

(51) Int. Cl.
*H01F 17/06* (2006.01)
*H03H 7/01* (2006.01)
(Continued)

(52) U.S. Cl.
CPC ............ *H01F 17/06* (2013.01); *H01F 1/344* (2013.01); *H01F 27/28* (2013.01); *H03H 7/0115* (2013.01)

(58) Field of Classification Search
CPC ............ H01F 17/06; H01F 2027/2819; H03H 7/0115; H03H 7/09; H03H 7/427
(Continued)

(56) References Cited

U.S. PATENT DOCUMENTS 5,242,760 A 9/1993 Matsuoka et al.
5,441,783 A 8/1995 Silgailis et al.
(Continued)

FOREIGN PATENT DOCUMENTS

JP 2006-238310 9/2006
JP 2007-081239 3/2007
(Continued)

OTHER PUBLICATIONS

Korean Office Action dated Jun. 24, 2020 issued in Application No. 10-2017-0183905.
(Continued)

*Primary Examiner* — Rakesh B Patel
(74) *Attorney, Agent, or Firm* — Ked & Associates LLP

(57) ABSTRACT

An inductor according to an embodiment of the present invention comprises: a first magnetic body having a toroidal shape, and including a ferrite; and a second magnetic body disposed on an outer circumferential surface or an inner circumferential surface of the first magnetic body, wherein the second magnetic body includes: resin material and a plurality of layers of metal ribbons wound along the circumferential direction of the first magnetic body, wherein the resin material comprises a first resin material disposed to cover an outer surface of the plurality of layers of metal ribbons, and a second resin material disposed in at least a part of a plurality of layers of interlayer spaces.

20 Claims, 12 Drawing Sheets

(51) Int. Cl.
*H01F 1/34* (2006.01)
*H01F 27/28* (2006.01)

(58) Field of Classification Search
USPC .................................................. 333/181, 185
See application file for complete search history.

(56) References Cited

U.S. PATENT DOCUMENTS

| 2006/0125586 | A1 | 6/2006 | Lee et al. |
| 2007/0257761 | A1 | 11/2007 | Mano et al. |
| 2008/0037298 | A1* | 2/2008 | Lafontaine ............. H03H 7/427 363/47 |
| 2015/0028772 | A1 | 10/2015 | Wang et al. |

FOREIGN PATENT DOCUMENTS

| KR | 10-2008-0027371 | 3/2008 |
| KR | 10-2010-0009381 | 1/2010 |
| KR | 10-2010-0128078 | 12/2010 |
| KR | 10-2015-0143251 | 12/2015 |

OTHER PUBLICATIONS

International Search Report dated Apr. 8, 2019 issued in Application No. PCT/KR2018/016326.

* cited by examiner

MAGNETIC CORE, INDUCTOR, AND EMI FILTER COMPRISING SAME

CROSS-REFERENCE TO RELATED PATENT APPLICATIONS

This application is a U.S. National Stage Application under 35 U.S.C. § 371 of PCT Application No. PCT/KR2018/016326, filed Dec. 20, 2018, which claims priority to Korean Patent Application No. 10-2017-0183905, filed Dec. 29, 2017, whose entire disclosures are hereby incorporated by reference.

TECHNICAL FIELD

The present disclosure relates to a magnetic core, an inductor, and an EMI filter including the same.

BACKGROUND ART

An inductor is one of electronic components that are used in printed circuit boards, and may be applied to resonance circuits, filter circuits, power circuits, etc. due to the electromagnetic characteristics thereof.

Meanwhile, an electromagnetic interference (EMI) filter used in a power board serves to transmit a signal necessary for the operation of a circuit and to remove noise.

FIG. 1 is a block diagram showing a construction whereby a general power board equipped with an EMI filter is connected to a power source and to a load.

Noise transmitted from the power board of the EMI filter shown in FIG. 1 may be largely classified into radiative noise of 30 MHz to 1 GHz radiated from the power board and conductive noise of 150 kHz to 30 MHz conducted via a power line.

A conductive noise transmission mode may be classified into a differential mode and a common mode. Among these modes, common-mode noise travels and returns along a large loop. Thus, the common-mode noise may affect electronic devices that are located far away, even when the amount thereof is small. Such common-mode noise is generated by impedance imbalance of a wiring system, and becomes remarkable at high frequencies.

In order to remove common-mode noise, an inductor that is applied to the EMI filter shown in FIG. 1 generally uses a toroidal-shaped magnetic core that includes a Mn—Zn-based ferrite material. Since Mn—Zn-based ferrite has a high magnetic permeability within a range from 100 kHz to 1 MHz, it is capable of effectively removing common-mode noise.

FIG. 2 is a perspective view of a general inductor 100.

Referring to FIG. 2, the inductor 100 may include a magnetic core 110 and a coil 120 wound around the magnetic core 110.

The magnetic core 110 may have a toroidal shape, and the coil 120 may include a first coil 122 wound around the magnetic core 110 and a second coil 124 wound so as to be opposite the first coil 122. Each of the first coil 122 and the second coil 124 may be wound around a top surface S1, a side surface S2 and a bottom surface S3 of the toroidal-shaped magnetic core 110.

The magnetic core 110 may further include a bobbin (not shown) for insulating the magnetic core 110 from the coil 120, and the coil 120 may be configured as a conductive wire coated on the surface thereof with an insulating material.

FIG. 3 is an exploded perspective view of the magnetic core shown in FIG. 2, in which a bobbin is further included, and FIG. 4 is a perspective view showing the process of forming the magnetic core shown in FIG. 3.

Referring to FIG. 3, the magnetic core 110 may be accommodated in the bobbin 130. The bobbin 130 may include an upper bobbin 132 and a lower bobbin 134.

Next, referring to FIG. 4(a), in the state in which the upper bobbin 132, the magnetic core 110 and the lower bobbin 132 are provided in the configuration shown in FIG. 3, the magnetic core 110 may be disposed on the bottom surface of the lower bobbin 132. Subsequently, as shown in FIG. 4(b), the upper bobbin 131 may be coupled to the product shown in FIG. 4(a). In this case, the respective components may be adhered to each other using an adhesive material.

Various efforts have been made to improve the performance of the inductor described above by, for example, forming the magnetic core 110 using different materials. In one example, a Fe—Si-based metal ribbon may be disposed on at least a portion of the surface of a toroidal-shaped magnetic core in which a Mn—Zn-based ferrite material is included, as described above. However, a metal ribbon is usually subjected to heat treatment at a high temperature (e.g. 500° C. to 600° C.) in order to obtain strong magnetic properties (i.e. high magnetic permeability). However, a metal ribbon that has undergone high-temperature heat treatment has improved magnetic properties but has excessively reduced strength, and is thus brittle and poorly resistant to small impacts, thereby making the conveyance and treatment thereof very difficult during the manufacturing process, resulting in deterioration in workability and yield of finished products.

DISCLOSURE

Technical Problem

An object of the present disclosure is to provide a magnetic core part having improved magnetic properties and strength, an inductor, and an EMI filter including the same.

Technical Solution

An inductor according to an embodiment includes a first magnetic body having a toroidal shape and including ferrite and a second magnetic body disposed on the outer circumferential surface or the inner circumferential surface of the first magnetic body. The second magnetic body includes a metal ribbon wound in multiple layers in the circumferential direction of the first magnetic body and a resin material. The resin material includes a first resin material disposed so as to cover the outer surface of the metal ribbon wound in the multiple layers and a second resin material disposed in at least a part of an interlayer space in the multiple layers.

For example, the first magnetic body may include Mn—Zn-based ferrite, the second magnetic body may include a Fe—Si-based metal ribbon, and the second resin material may be disposed in a region corresponding to 0% to 5% of the overall height of the second magnetic body and a region corresponding to 95% to 100% of the overall height of the second magnetic body in a direction from the bottom surface toward the top surface of the second magnetic body.

For example, the thickness of the first magnetic body in the diameter direction may be greater than the thickness of the second magnetic body in the diameter direction, and the thickness of the second magnetic body in the diameter direction may be greater than the thickness of the first resin material in the diameter direction.

For example, the thickness of the first resin material may be 20 μm to 30 μm.

For example, the height of the first resin material may be greater than the height of the second magnetic body.

For example, the second resin material may be disposed in a region corresponding to 15% to 30% of the interlayer space in the multiple layers.

For example, the second resin material may be disposed in a region corresponding to 20% to 25% of the interlayer space in the multiple layers.

An EMI filter according to an embodiment may include an inductor and a capacitor. The inductor may include a first magnetic body having a toroidal shape and including ferrite and a second magnetic body disposed on the outer circumferential surface or the inner circumferential surface of the first magnetic body. The second magnetic body may include a metal ribbon wound in multiple layers in the circumferential direction of the first magnetic body and a resin material. The resin material may include a first resin material disposed so as to cover the outer surface of the metal ribbon wound in the multiple layers and a second resin material disposed in at least a part of an interlayer space in the multiple layers.

For example, the first magnetic body may include Mn—Zn-based ferrite, the second magnetic body may include a Fe—Si-based metal ribbon, and the second resin material may be disposed in a region corresponding to 0% to 5% of the overall height of the second magnetic body and a region corresponding to 95% to 100% of the overall height of the second magnetic body in a direction from the bottom surface toward the top surface of the second magnetic body.

For example, a portion of the second resin material may be disposed in a region corresponding to 15% to 30% of the interlayer space in the multiple layers.

Advantageous Effects

In an inductor and an EMI filter including the same according to an embodiment, a magnetic core having the shape of a metal ribbon wound in multiple layers is coated with a resin material, thus improving the strength and magnetic properties thereof.

BEST MODE

Figure 1:
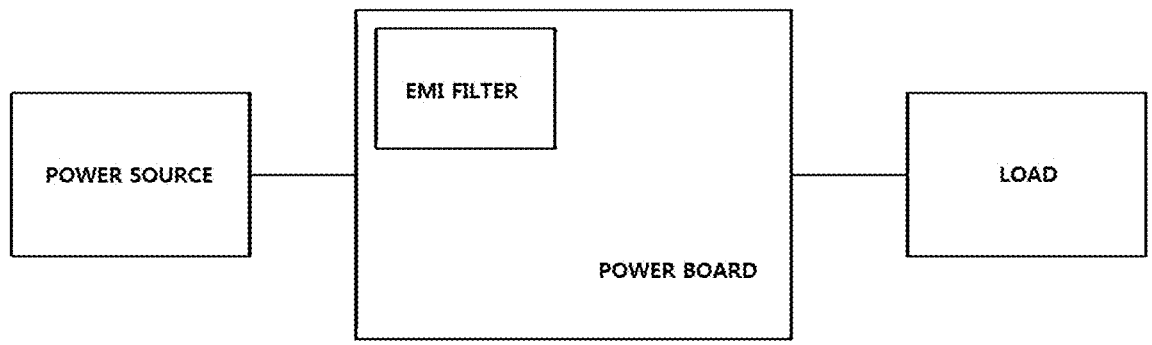
FIG. 1 is a block diagram showing a construction whereby a general power board equipped with an EMI filter is connected to a power source and to a load.
Figure 2:
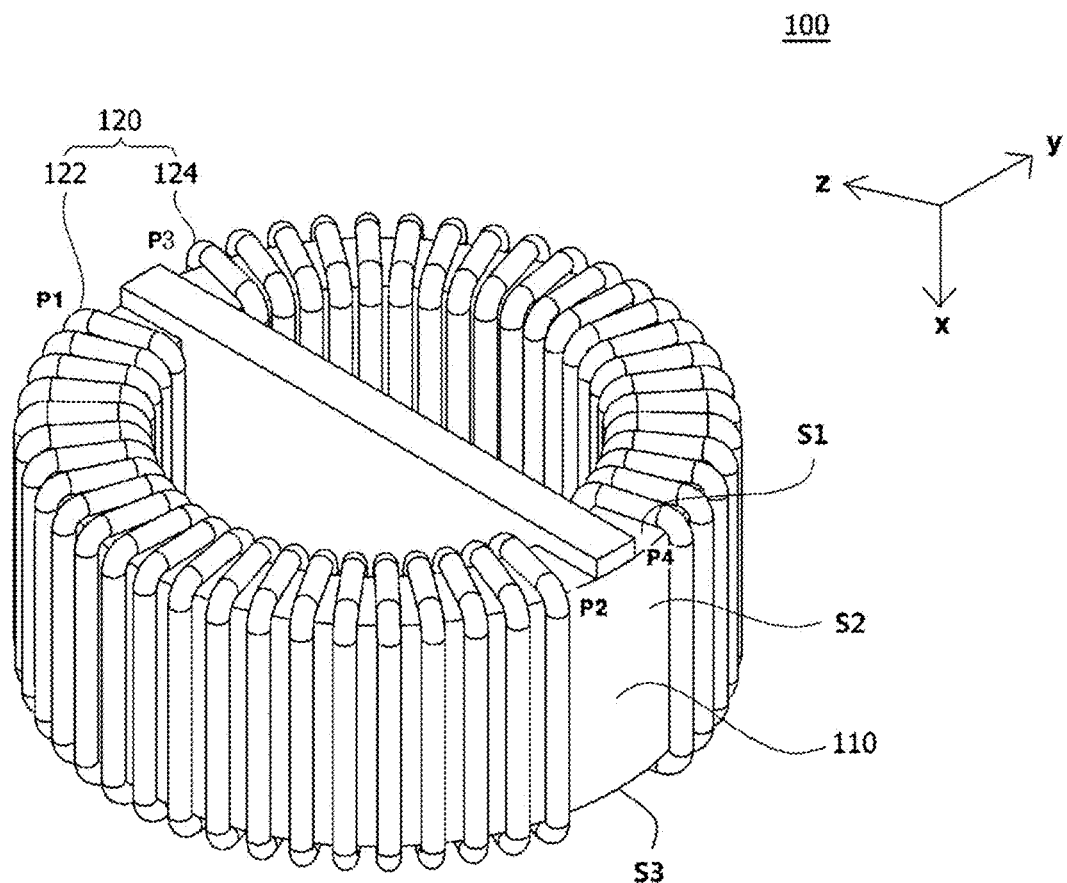
FIG. 2 is a perspective view of a general inductor.
Figure 3:
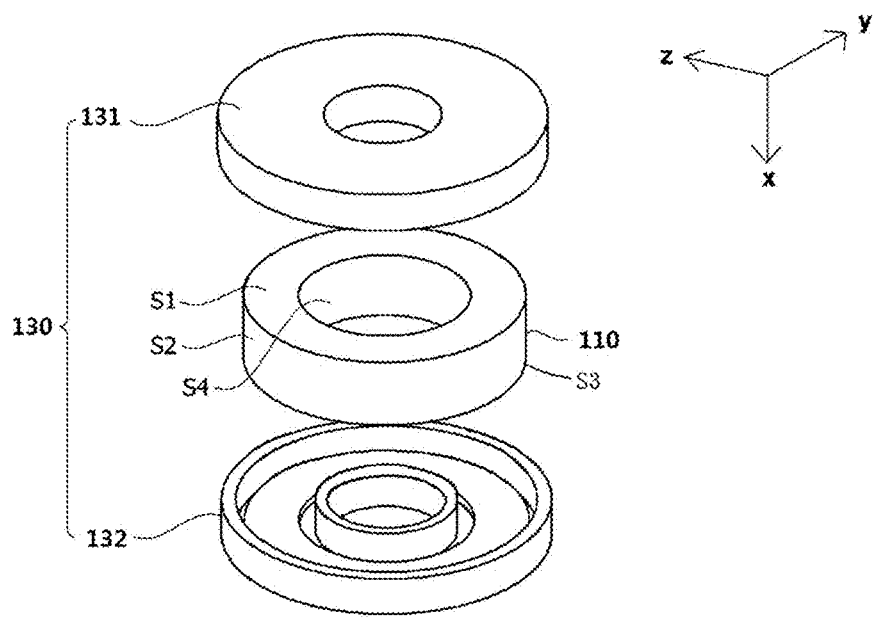
FIG. 3 is an exploded perspective view of the magnetic core shown in FIG. 2, in which a bobbin is further included.
Figure 4A:
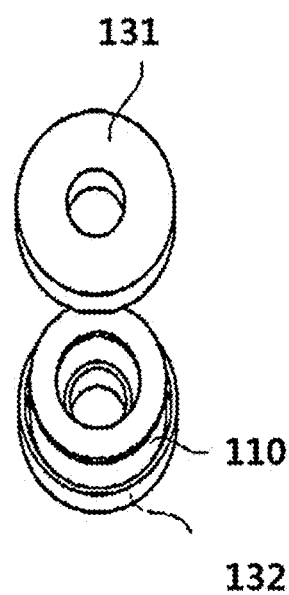
FIGS. 4(*a*) and 4(*b*) are perspective views showing the process of forming the magnetic core shown in FIG. 3.
Figure 4B:
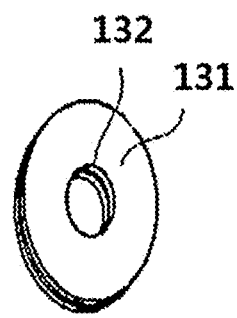

Exemplary embodiments can be variously changed and embodied in various forms, in which illustrative embodiments are shown. However, exemplary embodiments should not be construed as being limited to the embodiments set forth herein, and any changes, equivalents or alternatives which are within the spirit and scope of the embodiments should be understood as falling within the scope of the embodiments.

It will be understood that although the terms "second", "first", etc. may be used herein to describe various elements, these elements should not be construed as being limited by these terms. These terms are only used to distinguish one element from another element. For example, a second element may be termed a first element, and a first element may be termed a second element, without departing from the teachings of the embodiments. The term "and/or" includes any and all combinations of one or more of the associated listed items.

It will be understood that when an element is referred to as being "connected to" or "coupled to" another element, it may be directly connected or coupled to the other element, or intervening elements may be present. In contrast, when an element is referred to as being "directly connected to" or "directly coupled to" another element or layer, there are no intervening elements present.

In the description of the embodiments, it will be understood that when an element, such as a layer (film), a region, a pattern or a structure, is referred to as being "on" or "under" another element, such as a substrate, a layer (film), a region, a pad or a pattern, the term "on" or "under" means that the element is "directly" on or under another element, or is "indirectly" formed such that an intervening element may also be present. It will also be understood that criteria of on or under is on the basis of the drawing. The thickness or size of a layer (film), a region, a pattern, or a structure shown in the drawings may be exaggerated, omitted or schematically drawn for the convenience and clarity of explanation, and may not accurately reflect the actual size.

The terms used in the present specification are used for explaining specific exemplary embodiments, not limiting the present inventive concept. Thus, the singular expressions in the present specification include the plural expressions unless clearly specified otherwise in context. In the specification, the terms "comprising" or "including" shall be understood to designate the presence of particular features, numbers, steps, operations, elements, parts, or combinations thereof but not to preclude the presence or addition of one or more other features, numbers, steps, operations, elements, parts, or combinations thereof.

Unless otherwise defined, all terms including technical and scientific terms used herein have the same meanings as those commonly understood by one of ordinary skill in the art to which this inventive concept pertains. It will be further understood that terms, such as those defined in commonly used dictionaries, should be interpreted as having meanings consistent with their meanings in the context of the relevant art, and are not to be interpreted in an idealized or overly formal sense unless expressly so defined herein.

Hereinafter, embodiments will be described in detail with reference to the accompanying drawings. The same elements are denoted by the same reference numerals in the drawings, and a repeated explanation thereof will not be given.

According to an embodiment of the present disclosure, a magnetic core may include a first magnetic body and a second magnetic body formed of different materials from each other. Here, the second magnetic body may be disposed on at least a portion of the surface of the first magnetic body, and may include a metal ribbon wound in multiple layers. The second magnetic body according to the embodiment may include a resin material in order to solve the problem of reduced strength of the metal ribbon, wound in multiple layers, after heat treatment. The resin material may include a resin material covering the outer surface of the metal ribbon wound in multiple layers and a resin material disposed in at least a part of an interlayer space in the multiple layers. Here, an interlayer space may be a space between two ribbon layers that are adjacent to each other in the centrifugal direction when the metal ribbon is wound, specifically a space formed between the outer circumferential surface of a layer relatively close to the circle center and the inner circumferential surface of a layer relatively far from the circle center. A method of forming the resin material and the properties of the resin material will be described later in more detail. First, various embodiments in which mutually different magnetic bodies according to the embodiments of the present disclosure constitute the magnetic core will be described with reference to FIGS. 5 to 8. For convenience of description, an illustration of the resin material is omitted from FIGS. 5 to 7.

Figure 5:
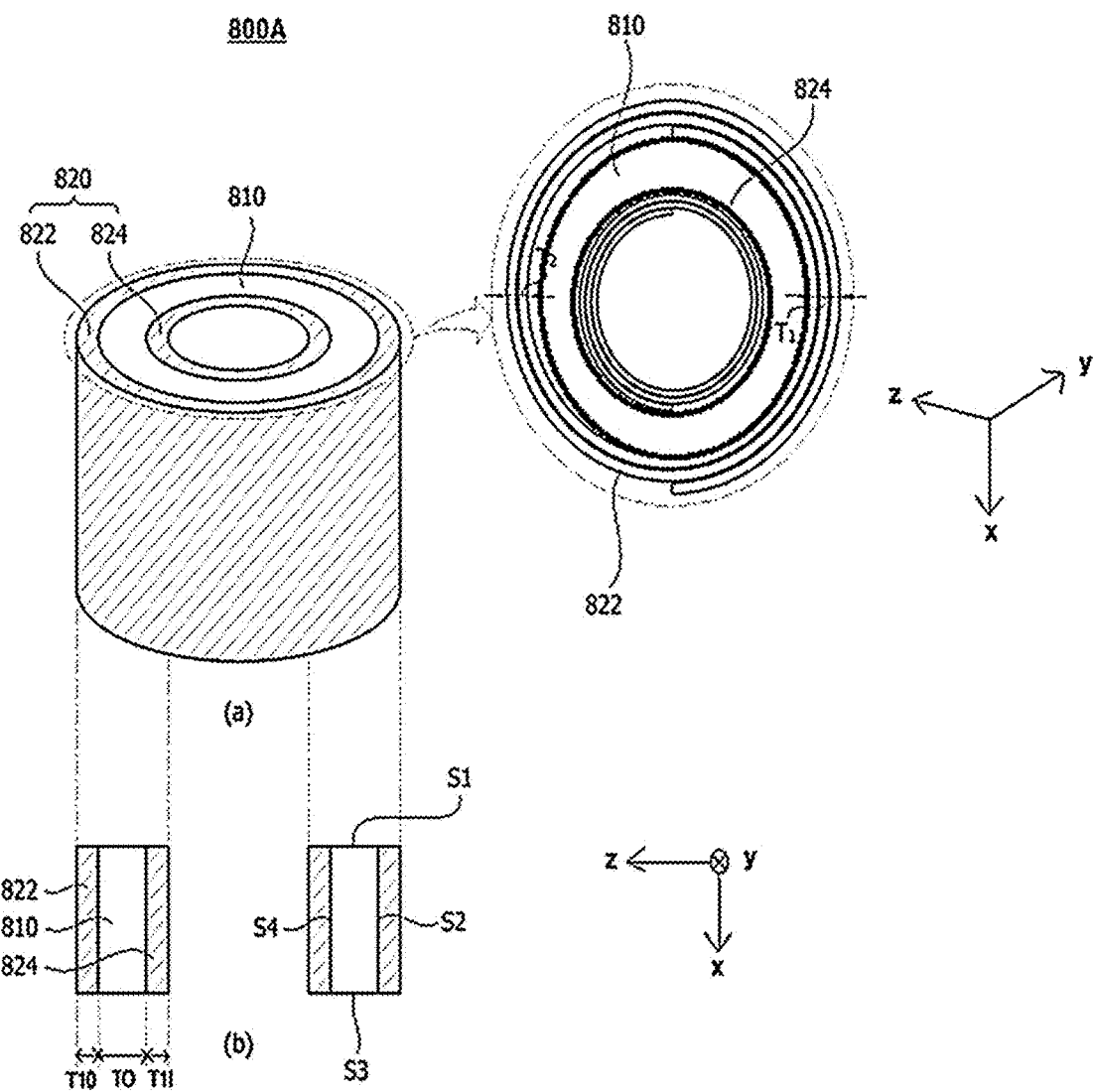
FIG. 5 illustrates a perspective view and a cross-sectional view of a magnetic core according to an embodiment of the present disclosure.
Figure 6:
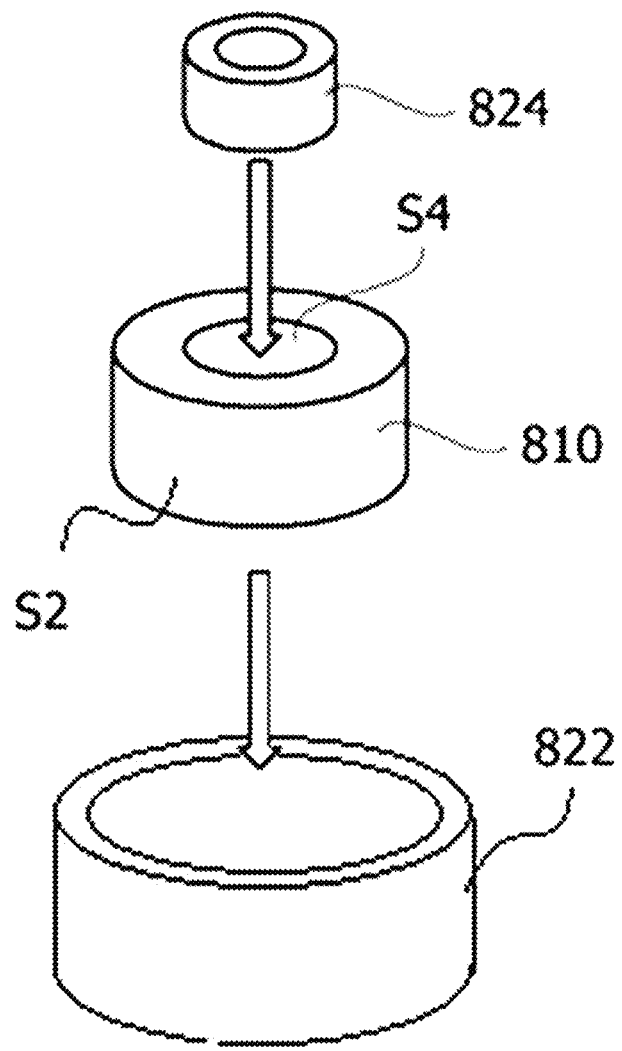
FIG. 6 is a view showing the process of forming the magnetic core of FIG. 5.

FIG. 5 illustrates a perspective view and a cross-sectional view of a magnetic core according to an embodiment of the present disclosure, FIG. 6 is a view showing the process of forming the magnetic core of FIG. 5, and FIGS. 7 to 9 are perspective views and cross-sectional views of magnetic cores according to other embodiments of the present disclosure.

Referring to FIG. 5, a magnetic core 800 may include a first magnetic body 810 and a second magnetic body 820. The first magnetic body 810 and the second magnetic body 820 may be formed of different materials, and the second magnetic body 820 may be disposed on at least a portion of the surface of the first magnetic body 810. In this case, the second magnetic body 820 may have a higher saturation magnetic flux density than the first magnetic body 810.

Here, the first magnetic body 810 may include ferrite, and the second magnetic body 820 may include a metal ribbon. Here, the magnetic permeability (μ) of ferrite may be 2,000 to 15,000, and the magnetic permeability (μ) of the metal ribbon may be 100,000 to 150,000. For example, the ferrite may be Mn—Zn-based ferrite, and the metal ribbon may be a Fe-based nanocrystalline metal ribbon. The Fe-based nanocrystalline metal ribbon may be a nanocrystalline metal ribbon including Fe and Si. The thickness of the metal ribbon may be 15 μm to 20 μm, without being limited thereto.

In this case, each of the first magnetic body 810 and the second magnetic body 820 has a toroidal shape, and the second magnetic body 820 may include a second outer magnetic body 822 disposed on the outer circumferential surface S2 of the first magnetic body 810 and a second inner magnetic body 824 disposed on the inner circumferential surface S4 of the first magnetic body 810.

In this case, each of the thicknesses of the second outer magnetic body 822 and the second inner magnetic body 824 is smaller than the thickness of the first magnetic body 810. The magnetic permeability of the magnetic core 800 may be adjusted by adjusting at least one of the ratio of the thickness of the second outer magnetic body 822 to the thickness of the first magnetic body 810 or the ratio of the thickness of the second inner magnetic body 824 to the thickness of the first magnetic body 810.

In order to manufacture such a magnetic core, as shown in FIG. 6, two second magnetic bodies 822 and 824 are separately prepared. Each of the second magnetic bodies 822 and 824 may be configured as a metal ribbon wound in multiple layers and coated with a resin material. Among the prepared second magnetic bodies 822 and 824, the second inner magnetic body 824 corresponding to the inner circumferential surface S4 of the first magnetic body 810 having a toroidal shape may be inserted into a hollow portion in the first magnetic body 810, and the first magnetic body 810 may be inserted into a hollow portion in the second outer magnetic body 822 corresponding to the outer circumferential surface S2 of the first magnetic body 810. Of course, the order in which the second magnetic bodies are coupled to the first magnetic body 810 may be changed.

In this case, the outer circumferential surface S2 of the first magnetic body 810 may be adhered to the second outer magnetic body 822, and the inner circumferential surface S4 of the first magnetic body 810 may be adhered to the second inner magnetic body 824 using an adhesive. In this case, the adhesive may be an adhesive including at least one of epoxy-based resin, acrylic-based resin, silicon-based resin, or varnish. As such, when the mutually different magnetic bodies are adhered to each other using an adhesive, it is possible to prevent the performance from being deteriorated by physical vibration.

Here, as shown in FIG. 5, each of the second magnetic bodies 822 and 824 may include a metal ribbon wound multiple turns so as to be stacked in multiple layers. The thickness and magnetic permeability of the second magnetic bodies 822 and 824 may vary depending on the number of layers in which the metal ribbon is stacked, and accordingly, the magnetic permeability of the magnetic core 800 may vary, and the noise removal performance of an EMI filter equipped with the magnetic core 800 may vary.

That is, when the thicknesses of the second magnetic bodies 822 and 824 are increased, the noise removal performance may be improved. Using this principle, the number of layers in which the metal ribbon is stacked may be adjusted such that the thicknesses of the second magnetic bodies 822 and 824 disposed in a region in which the coil is wound are greater than the thicknesses of the second magnetic bodies 822 and 824 disposed in a region in which the coil is not wound.

The number of layers in which the metal ribbon is stacked may be adjusted by changing the number of windings, the starting point of winding, and the ending point of winding. The relationship between the starting point of winding and the ending point of winding will be described based on the second outer magnetic body 822, disposed on the outer circumferential surface S2 of the first magnetic body 810, as shown in FIG. 5(*a*). Of course, as described above, winding of the second outer magnetic body 822 and formation of the resin material (not shown) thereon are completed before the second outer magnetic body 822 is coupled to the first magnetic body 810. However, for convenience of description, it is assumed that winding starts from a certain point on the outer circumferential surface of the first magnetic body 810.

When the second outer magnetic body 822, which is a metal ribbon, is wound one turn from the starting point of winding, the second outer magnetic body 822 may include a one-layered metal ribbon. When the second outer magnetic body 822 is wound two turns from the starting point of winding, the second outer magnetic body 822 may include a two-layered metal ribbon. Meanwhile, when the starting point of winding and the ending point of winding do not coincide with each other, for example, when the second outer magnetic body 822 is wound one and a half turns from the starting point of winding, the second outer magnetic body 822 includes a region in which the metal ribbon is stacked in a single layer and a region in which the metal ribbon is stacked in two layers. Alternatively, when the second outer magnetic body 822 is wound two and a half turns from the starting point of winding, the second outer magnetic body 822 includes a region in which the metal ribbon is stacked in two layers and a region in which the metal ribbon is stacked in three layers. In this case, if the coil is disposed on the region in which the number of layers in which the metal ribbon is stacked is greater, the noise removal performance of an EMI filter to which the magnetic core 800 according to the embodiment of the present disclosure is applied may be further improved.

For example, in the case in which the magnetic core 800 has a toroidal shape and the first coil 122 and the second coil 124 are wound so as to be symmetrical to each other around the magnetic core 800, the first coil 122 may be disposed on a region in which the number of stacked layers of the second outer magnetic body 822, which is disposed on the outer circumferential surface of the first magnetic body 810, is relatively large, and the second coil 124 may be disposed on a region in which the number of stacked layers of the second inner magnetic body 824, which is disposed on the inner circumferential surface of the first magnetic body 810, is relatively large. Accordingly, each of the first coil 122 and the second coil 124 may be disposed on a region in which the number of stacked layers of a respective one of the second magnetic bodies 822 and 824 is relatively large, but may not be disposed on a region in which the number of stacked layers of a respective one of the second magnetic bodies 822 and 824 is relatively small, thereby achieving improved noise removal performance.

Although the second outer magnetic body 822 and the second inner magnetic body 824 are illustrated as being made of the same material and having the same thickness, the disclosure is not limited thereto. The second outer magnetic body 822 and the second inner magnetic body 824 may have different materials or different values of magnetic permeability, and may have different thicknesses. Therefore, the magnetic permeability of the magnetic core 800 may have a wide range of values.

Figure 7:
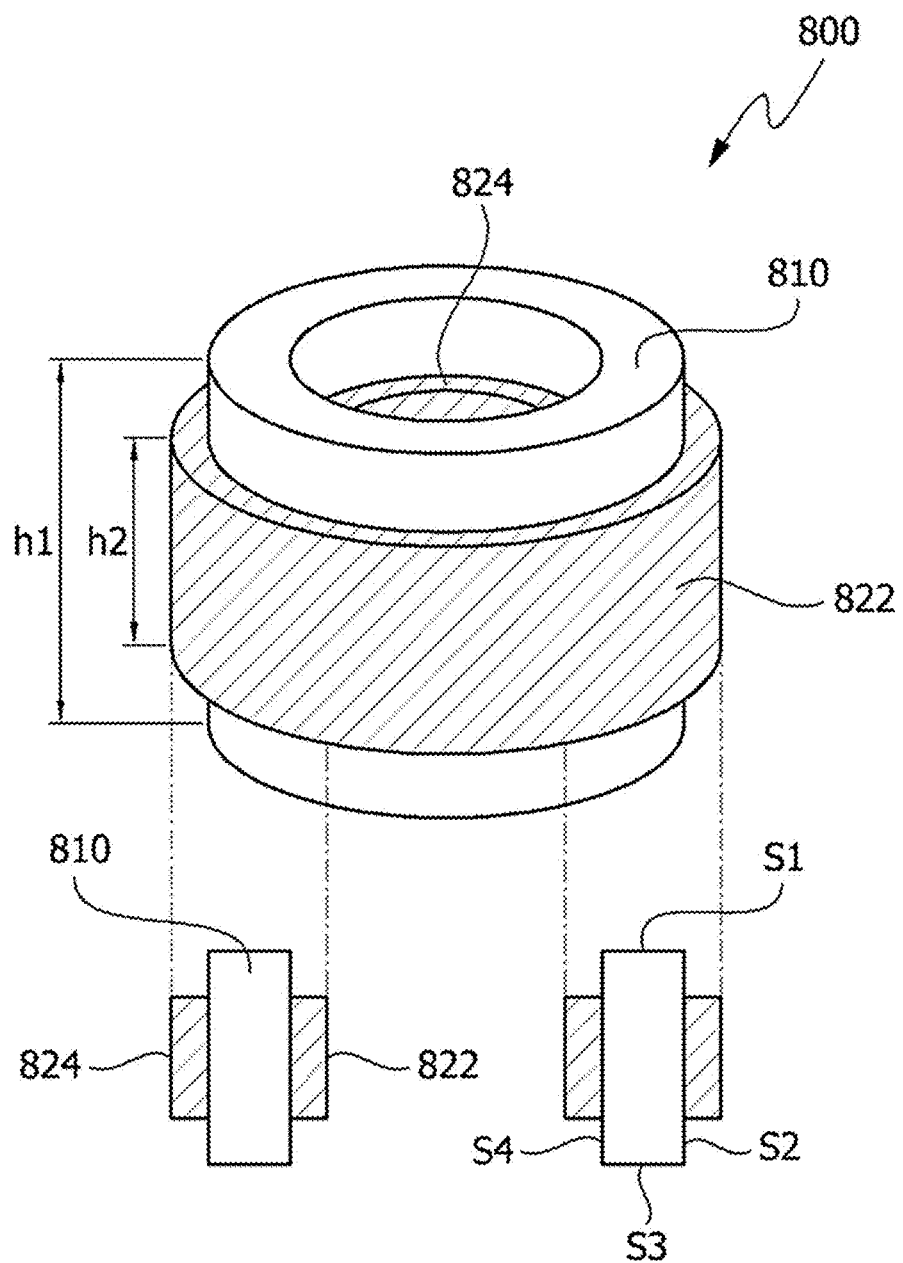
FIGS. 7, 8(*a*), 8(*b*), 8(*c*) and 9 are perspective views and cross-sectional views of magnetic cores according to other embodiments of the present disclosure.

Meanwhile, as shown in FIG. 7, the height h1 of the first magnetic body 810 may be greater than the height h2 of the second magnetic body 820. To this end, in the process of manufacturing the second magnetic body 820, a metal ribbon having a width less than the height h1 of the first magnetic body 810 may be wound. Accordingly, the second outer magnetic body 822 may not be disposed on the boundary between the top surface S1 and the outer circumferential surface S2 of the first magnetic body 810 and the boundary between the bottom surface S3 and the outer circumferential surface S2 of the first magnetic body 810, and the second inner magnetic body 824 may not be disposed on the boundary between the top surface S1 and the inner circumferential surface S4 of the first magnetic body 810 and the boundary between the bottom surface S3 and the inner circumferential surface S4 of the first magnetic body 810. Therefore, the second outer magnetic body 822 may be prevented from cracking along the boundary between the top surface S1 and the outer circumferential surface S2 of the first magnetic body 810, the boundary between the bottom surface S3 and the outer circumferential surface S2 of the first magnetic body 810, the boundary between the top surface S1 and the inner circumferential surface S4 of the first magnetic body 810, or the boundary between the bottom surface S3 and the inner circumferential surface S4 of the first magnetic body 810.

Figure 8A:
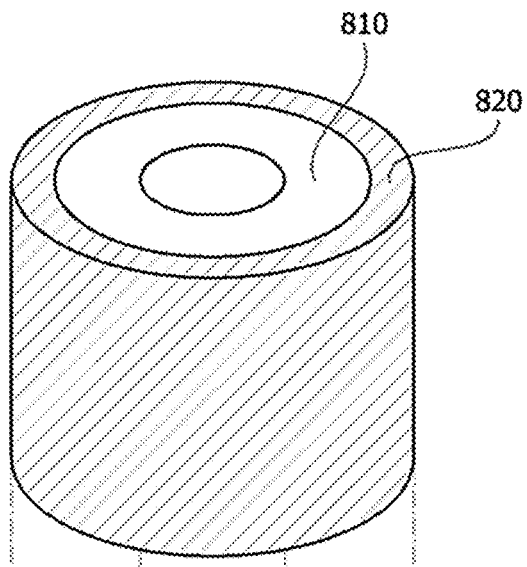
Figure 8B:
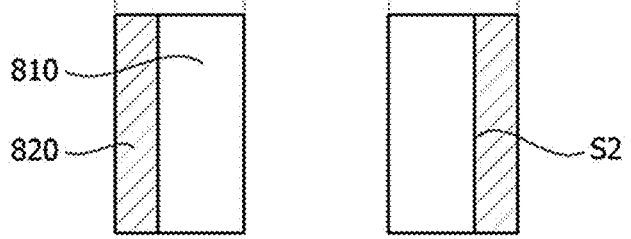

Alternatively, as shown in FIG. 8, the second magnetic body 820 may be disposed only on the outer circumferential surface S2 of the first magnetic body 810. Alternatively, as shown in FIG. 9, the second magnetic body 820 may be disposed only on the inner circumferential surface S4 of the first magnetic body 810.

With the above-described configuration, in which the magnetic core 800 includes the mutually different magnetic bodies having different values of magnetic permeability, it is possible to remove noise over a wide frequency band. In particular, compared to a toroidal-shaped magnetic core that is formed only of Mn—Zn-based ferrite, the magnetic core according to the embodiment is capable of effectively removing high-frequency noise by preventing concentration of magnetic flux on the surface thereof, and is capable of being applied to high-power products due to the low degree of internal saturation. Further, the performance of the magnetic core 800 may be adjusted by adjusting the values of magnetic permeability or the volume ratios of the first magnetic body 810 and the second magnetic body 820.

Figure 10:
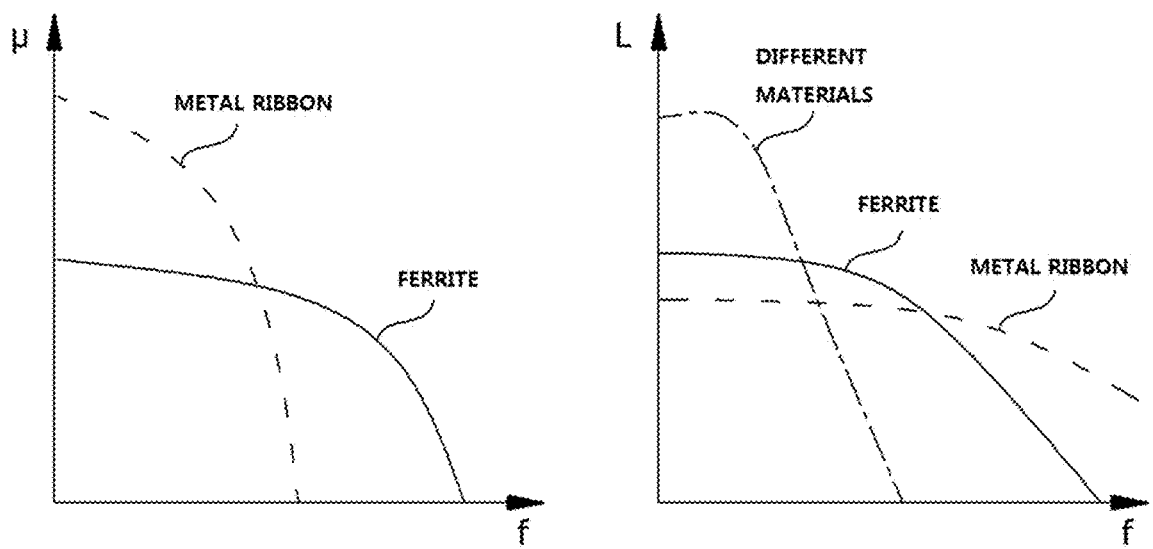
FIG. 10 is a graph showing the magnetic permeability and inductance of a ferrite material and a metal ribbon material.

Meanwhile, referring to FIG. 10, it can be seen that a magnetic core including a ferrite material and a metal ribbon material, which have different values of magnetic permeability according to frequency, has high inductance in a predetermined frequency range, and thus improves noise removal performance.

The arrangement relationship between the first magnetic body and the second magnetic body according to the embodiments has been described above. Hereinafter, a resin material of the second magnetic body according to an embodiment of the present disclosure will be described in more detail.

According to an embodiment, the resin material may be formed by performing heat treatment on a metal ribbon wound in multiple layers, dipping the product that has undergone heat treatment in a coating solution, and drying the same. Depending on the embodiment, the drying process may include performing a thermal drying process at a temperature of 60° C. to 150° C.

Figure 8C:
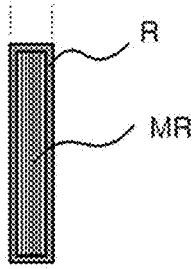
Figure 9:
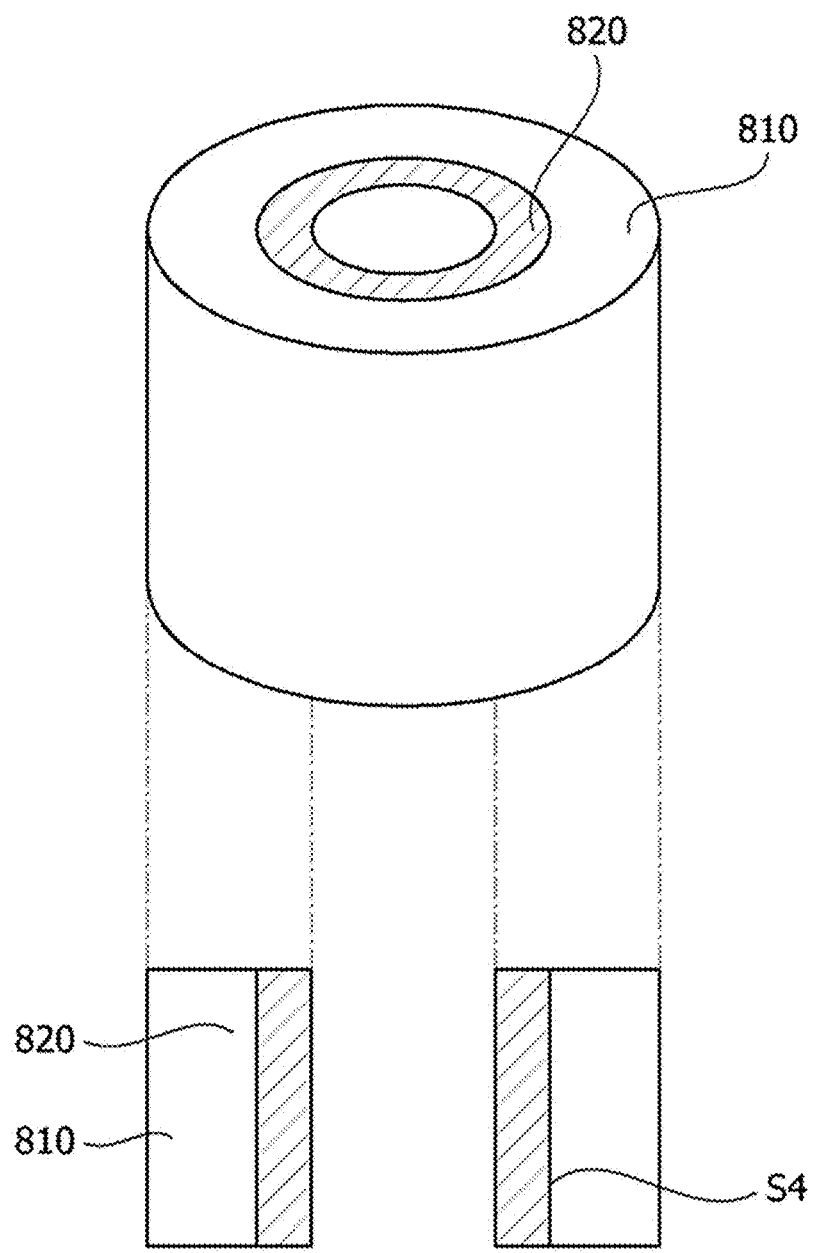

As shown in FIG. 8(c), in the second magnetic body 820, the resin material R may be disposed on the outer surface (the top surface, the bottom surface, the inner circumferential surface, and the outer circumferential surface) of the wound metal ribbon MR, and may also be disposed between the wound layers (not shown) of the metal ribbon.

According to an embodiment, the coating solution may be a mixed solution in which an epoxy resin and a diluent are mixed at a predetermined ratio. The diluent is not limited to any specific component, so long as it is capable of dissolving the epoxy resin. Tables 1 to 4 below show examples of the result of measuring an inductance reduction rate by varying the ratio of the epoxy resin to the diluent.

TABLE 1

| Ratio of Epoxy to Diluent | Sample | Inductance (@16 kHz) Before Dipping | Inductance (@16 kHz) After Dipping | Reduction Rate (%) |
|---|---|---|---|---|
| 5:5 | #1 | 65.52 | 45.16 | −31.08 |
| | #2 | 60.43 | 42.78 | −29.2 |
| | #3 | 59.42 | 41.72 | −29.79 |
| | #4 | 65.25 | 46.03 | −29.46 |
| | #5 | 64.23 | 47.08 | −26.7 |
| | #6 | 55.08 | 41.16 | −25.28 |
| | #7 | 62.06 | 41.94 | −32.42 |
| | #8 | 64.57 | 43.49 | −32.64 |
| | #9 | 63.11 | 43.49 | −31.09 |
| | #10 | 72.68 | 50.88 | −29.99 |
| | Avg. | 63.23 | 44.37 | −29.76 |

TABLE 2

| Ratio of Epoxy to Diluent | Sample | Inductance (@16 kHz) Before Dipping | Inductance (@16 kHz) After Dipping | Reduction Rate (%) |
|---|---|---|---|---|
| 3:7 | #1 | 60.96 | 58.96 | −3.28 |
| | #2 | 76.36 | 66.32 | −13.15 |
| | #3 | 75.26 | 64.16 | −14.75 |
| | #4 | 64.41 | 49.25 | −23.54 |
| | #5 | 58.02 | 50.02 | −13.79 |
| | #6 | 61.46 | 45.99 | −25.18 |
| | #7 | 51.35 | 44.05 | −14.22 |
| | #8 | 52.56 | 45.64 | −13.15 |
| | #9 | 53.93 | 46.08 | −14.56 |
| | #10 | 49.89 | 42.64 | −14.54 |
| | Avg. | 60.42 | 51.31 | −15.02 |

TABLE 3

| Ratio of Epoxy to Diluent | Sample | Inductance (@16 kHz) Before Dipping | Inductance (@16 kHz) After Dipping | Reduction Rate (%) |
|---|---|---|---|---|
| 2:8 | #1 | 60.92 | 53.93 | −11.47 |
| | #2 | 55.4 | 53.68 | −3.1 |
| | #3 | 49.27 | 44.4 | −9.88 |
| | #4 | 45.79 | 48.19 | 5.24 |
| | #5 | 58.26 | 54.78 | −5.97 |
| | #6 | 61.64 | 54.8 | −11.1 |
| | #7 | 62.14 | 56.59 | −8.93 |
| | #8 | 53.22 | 51.44 | −3.34 |
| | #9 | 49.35 | 46.89 | −4.98 |
| | #10 | 44.92 | 43.28 | −3.65 |
| | Avg. | 54.09 | 50.8 | −5.72 |

TABLE 4

| Ratio of Epoxy to Diluent | Sample | Inductance (@16 kHz) Before Dipping | Inductance (@16 kHz) After Dipping | Reduction Rate (%) |
|---|---|---|---|---|
| 1:9 | #1 | 49.14 | 46.18 | −6.02 |
| | #2 | 44.47 | 42.21 | −5.09 |
| | #3 | 38.33 | 36.68 | −4.3 |
| | #4 | 38.92 | 36.43 | −6.39 |
| | #5 | 40.07 | 36.93 | −7.85 |
| | #6 | 49.13 | 49.68 | 1.13 |
| | #7 | 57.5 | 55.41 | −3.63 |
| | #8 | 44.08 | 42.13 | −4.43 |
| | #9 | 41.62 | 41.4 | −0.54 |
| | #10 | 44.62 | 40.23 | −9.84 |
| | Avg. | 44.79 | 42.73 | −4.7 |

Referring to Tables 1 to 4, it can be seen that the higher the content of the epoxy resin, the higher the inductance reduction rate and that the higher the content of the diluent, the lower the inductance reduction rate. Specifically, when the ratio of the epoxy resin to the diluent was 5:5, the inductance reduction rate was approximately 30 percent, and when the ratio of the epoxy resin to the diluent was 3:7, the inductance reduction rate was approximately 15 percent. However, when the ratio of the epoxy resin to the diluent was 2:8 and when the ratio of the epoxy resin to the diluent was 1:9, slightly different inductance reduction rates, which were 5.72% and 4.7%, respectively, were obtained. That is, relatively low inductance reduction rates were obtained.

Next, the strength of each diluent is shown in Table 5.

TABLE 5

| Sample | Before Dipping | Ratio of Epoxy to Diluent | | | |
| | | 5:5 | 3:7 | 2:8 | 1:9 |
|---|---|---|---|---|---|
| #1 | 75 | 757 | 515 | 386 | 240 |
| #2 | 56 | 806 | 494 | 511 | 297 |
| #3 | 62 | 770 | 544 | 420 | 250 |
| #4 | 68 | 774 | 580 | 583 | 213 |
| #5 | 80 | 857 | 482 | 467 | 222 |
| #6 | 61 | 821 | 543 | 520 | 236 |
| #7 | 88 | 890 | 490 | 478 | 221 |
| #8 | 69 | 874 | 340 | 478 | 234 |
| #9 | 76 | 745 | 422 | 460 | 219 |
| #10 | 63 | 717 | 499 | 425 | 174 |
| Avg. | 69.8 | 801.1 | 490.9 | 472.8 | 230.6 |

Table 5 shows the external force in units of "g", by which a metal ribbon, which has been wound 15 turns and has undergone heat treatment, is damaged when a specific point on the outer circumferential surface of the metal ribbon is pressed. Referring to Table 5, it can be seen that a metal ribbon before being dipped in a coating solution was damaged when external force of about 70 g was applied thereto, but that the strength thereof was increased about 3 times to 10 times or more depending on the ratio of the epoxy resin to the diluent.

The reason for the difference in the increase in strength depending on the dilution ratio is that, when a metal ribbon is pulled up after dipping, a larger amount of epoxy remains on the edges of the metal ribbon due to the difference in viscosity of the epoxy resin depending on the dilution ratio of a coating solution (i.e. a dipping solution). Another reason is an increase in the amount of epoxy resin that enters the interlayer space between multiple layers of the wound metal ribbon in the dipping solution. Furthermore, the volume of the epoxy resin increases in the interlayer space between the multiple layers of the wound metal ribbon during a drying process, which increases fine cracking in the metal ribbon, resulting in reduced inductance. This will be described with reference to FIGS. 11 to 13. Although not shown, when the overall height of the second magnetic body 820 is defined as the distance from the bottom surface to the top surface of the second magnetic body 820, the resin material, which is disposed in the interlayer space in the wound ribbon in FIGS. 11 to 13, may be disposed in a region corresponding to 0% to 5% of the overall height of the second magnetic body 820 and a region corresponding to 95% to 100% of the overall height of the second magnetic body 820 in a direction from the bottom surface toward the top surface of the second magnetic body 820. Preferably, the resin material may be disposed in a region corresponding to 0% to 15% of the overall height of the second magnetic body 820 and a region corresponding to 85% to 100% of the overall height of the second magnetic body 820 in a direction from the bottom surface toward the top surface of the second magnetic body 820. More preferably, the resin material may be disposed in a region corresponding to 0% to 30% of the overall height of the second magnetic body 820 and a region corresponding to 70% to 100% of the overall height of the second magnetic body 820 in a direction from the bottom surface toward the top surface of the second magnetic body 820. When the resin material is disposed in a region corresponding to 31% to 69% of the overall height of the second magnetic body 820 in a direction from the bottom surface toward the top surface of the second magnetic body 820, the improvement of strength and the inductance reduction rate may be insufficient.

Figure 11:
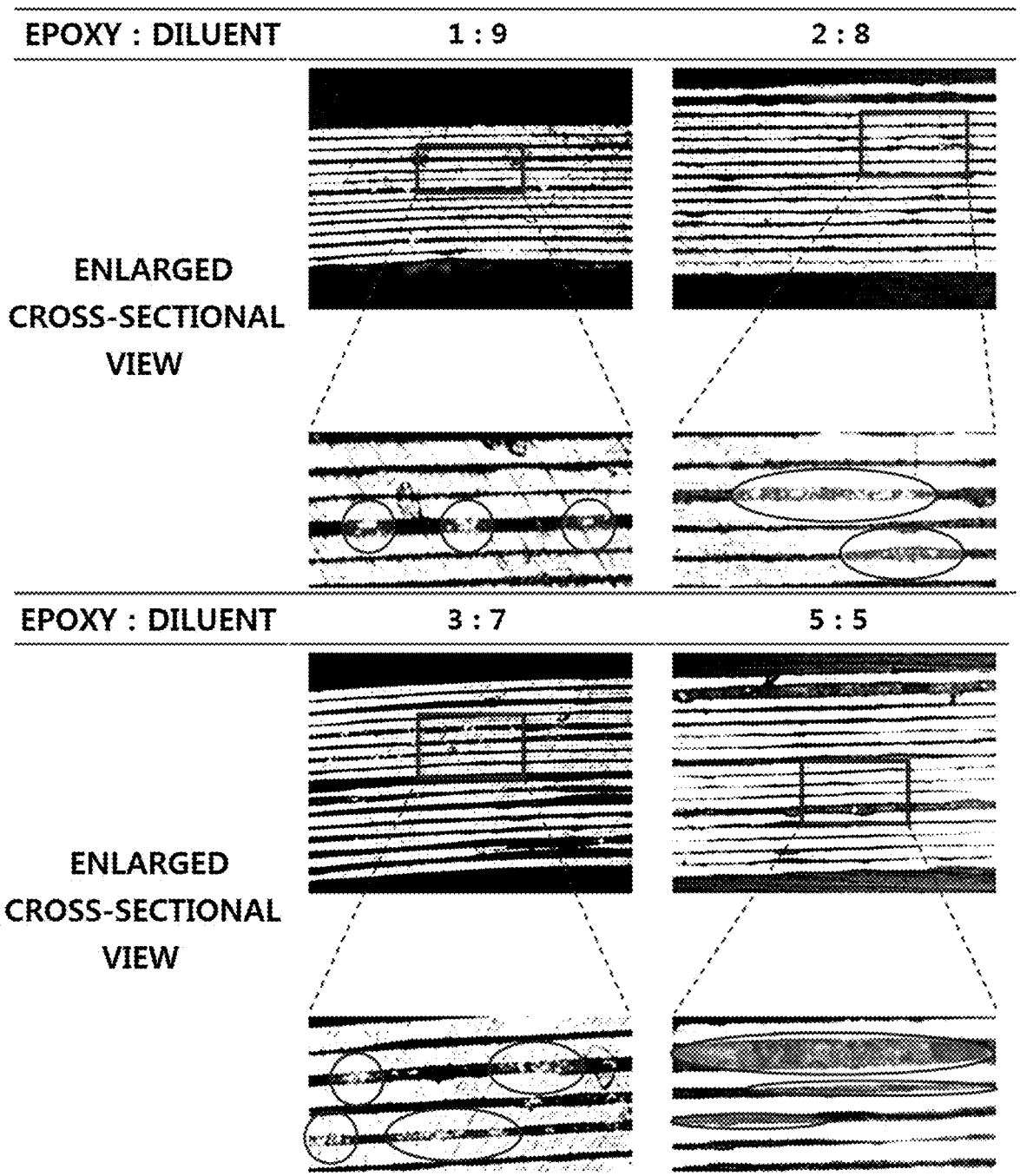
FIG. 11 shows cross-sectional images showing an area occupied by epoxy in an interlayer space depending on the dilution ratio of an epoxy coating solution according to an embodiment.

FIG. 11 shows cross-sectional images showing the area occupied by epoxy in an interlayer space depending on the dilution ratio of an epoxy coating solution according to the embodiment. FIG. 11 shows enlarged images of the cross-section of the second magnetic body when the second magnetic body is cut in a circumferential direction after a metal ribbon wound 15 turns is dipped in epoxy coating solutions having different respective dilution ratios. Further, in FIG. 11, the lower end of each of the images is oriented toward the center of a circle, the upper image corresponding to each dilution ratio is an image showing the overall shape of a 15-layered metal ribbon, the lower image corresponding to each dilution ratio is a further enlarged image showing only a 5-layered metal ribbon, and circles in each lower image indicate regions in which epoxy resin is disposed.

Referring to FIG. 11, when the ratio of the epoxy to the diluent is 1:9, epoxy resin is disposed in a region corresponding to about 10% of the entirety of the space between the ribbon layers that are adjacent to each other in the centrifugal direction, i.e. the interlayer space. When the ratio of the epoxy to the diluent is 2:8, epoxy resin is disposed in a region corresponding to about 25% of the entirety of the interlayer space. When the ratio of the epoxy to the diluent is 3:7, epoxy resin is disposed in a region corresponding to about 30% of the entirety of the interlayer space. When the ratio of the epoxy to the diluent is 5:5, epoxy resin is disposed in a region corresponding to about 50% of the entirety of the interlayer space.

Referring to FIG. 11, it can be seen that the strength varies depending on the area occupied by the epoxy resin in the interlayer space.

Hereinafter, the inductance reduction rates shown in Tables 1 to 4 and the increases in strength shown in Table 5 will be compared in detail.

When the ratio of the epoxy to the diluent was 5:5, the strength was the highest, but the inductance reduction rate was too high. When the ratio of the epoxy to the diluent was 1:9, the inductance reduction rate was the lowest, but the degree of increase in strength was low.

Further, when the ratios of the epoxy to the diluent were 2:8 and 1:9, they exhibited improved effects in terms of the inductance reduction rate, and when the ratios of the epoxy to the diluent were 2:8 and 3:7, they exhibited improved effects in terms of the increase in strength.

In conclusion, when the ratio of the epoxy to the diluent was 2:8, it exhibited an improved inductance reduction rate, which was similar to that when the ratio was 1:9, and exhibited increased strength, which was similar to that when the ratio was 3:7. Thus, it can be seen that the most desirable ratio of the epoxy to the diluent is 2:8.

Hereinafter, the area occupied by the epoxy in the interlayer space when the ratio of the epoxy to the diluent is 2:8 will be described in more detail with reference to FIGS. 12 and 13.

Figure 12:
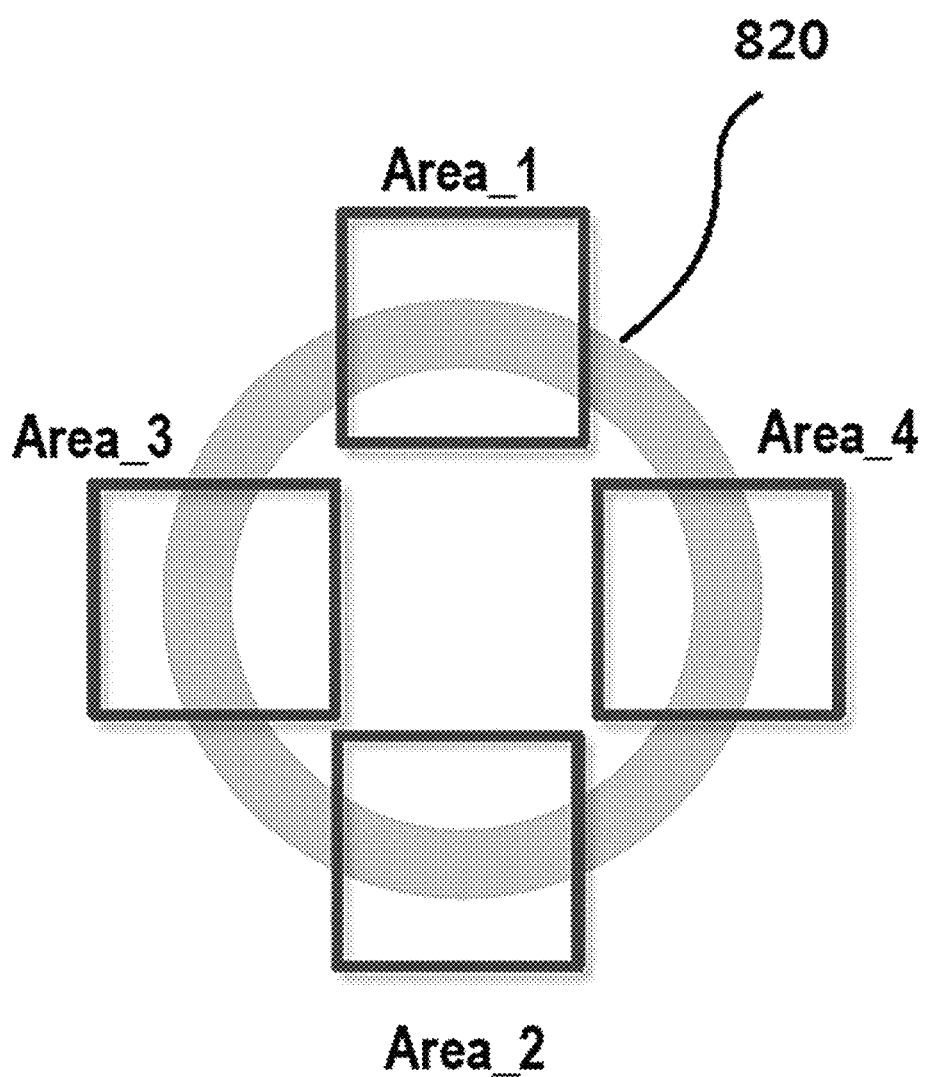
FIG. 12 is a view showing areas in which samples according to the embodiment were measured.
Figure 13A:
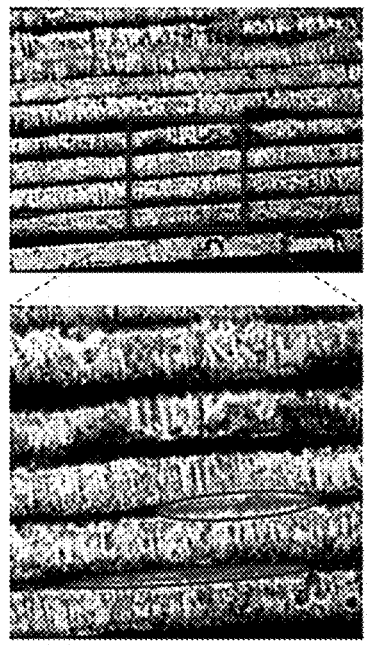
FIGS. 13(*a*) to 13(*d*) show the measurement results in the areas of FIG. 12.
Figure 13B:
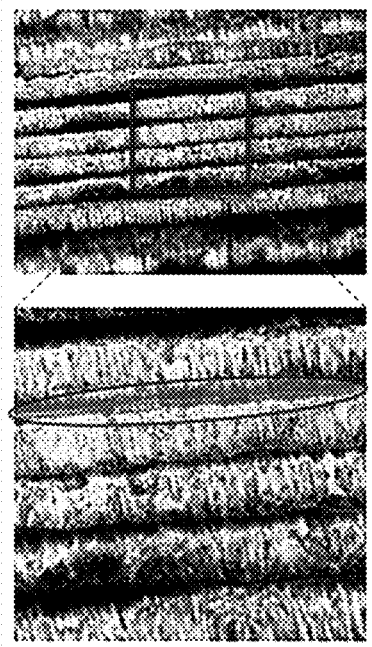
Figure 13C:
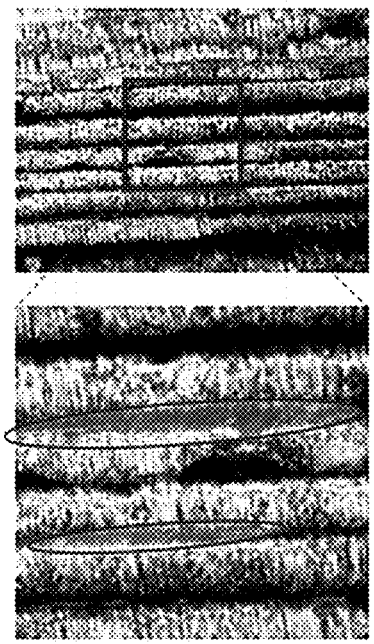
Figure 13D:
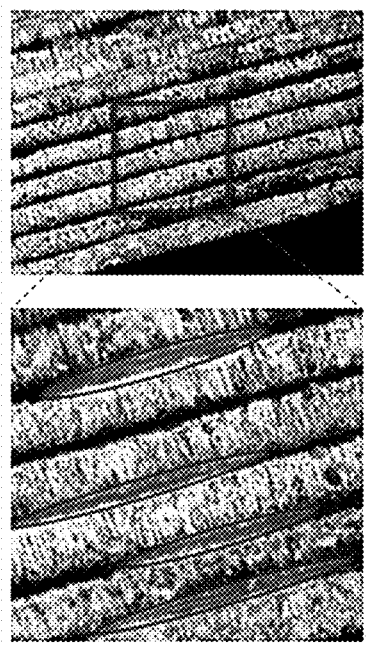

FIG. 12 is a view showing areas in which samples according to the embodiment were measured, and FIG. 13 shows the measurement results in the areas of FIG. 12.

FIG. 12 is a plan view of the second magnetic body 820 dried after being dipped in a coating solution having a dilution ratio of 2:8 according to the embodiment. In order to measure the area occupied by epoxy in the interlayer space, one second magnetic body 820 was divided into four areas Area_1 to Area_4, and the cross-section of each area taken in a circumferential direction was photographed. Therefore, the area occupied by epoxy in the interlayer space was measured 4 times using one sample of the second magnetic body, and a total of 20 measurement processes were performed using 5 samples.

FIG. 13 shows the images of some samples captured during the measurement processes. FIG. 13 shows enlarged images of the cross-section of the second magnetic body when the second magnetic body is cut in a circumferential direction after a metal ribbon wound 15 turns is dipped in an epoxy coating solution having a dilution ratio of 2:8. Further, in FIG. 13, the lower end of each of the images is oriented toward the center of a circle, each upper image shows the cross-section, a portion of which is shown through a lower image in detail, each lower image is a further enlarged image showing only a 5-layered metal ribbon, and circles in each lower image indicate regions in which epoxy resin is disposed.

Referring to FIG. 13(*a*), the epoxy resin occupies an area corresponding to 15% of the interlayer space. Referring to FIG. 13(*b*), the epoxy resin occupies an area corresponding to 20% of the interlayer space. Referring to FIG. 13(*c*), the epoxy resin occupies an area corresponding to 25% of the interlayer space. Referring to FIG. 13(*d*), the epoxy resin occupies an area corresponding to 30% of the interlayer space.

In conclusion, when the dilution ratio is 2:8, the area occupied by the epoxy in the interlayer space corresponds to 15% to 30% of the interlayer space, which is a range including the maximum value and the minimum value. The results of 20 measurement processes are shown in Table 6 below.

TABLE 6

| Sample | Area_1 | Area_2 | Area_3 | Area_4 | Total |
|---|---|---|---|---|---|
| #1 | 15 | 25 | 30 | 25 | |
| #2 | 25 | 20 | 25 | 20 | |
| #3 | 25 | 15 | 25 | 20 | |
| #4 | 30 | 30 | 25 | 30 | |
| #5 | 25 | 25 | 20 | 25 | |
| Avg. | 24 | 23 | 25 | 24 | 24 |

Referring to Table 6, among a total of 20 experiments, 15% was measured in two experiments, 20% was measured in four experiments, 25% was measured in seven experiments, and 30% was measured in three experiments. Therefore, when the dilution ratio is 2:8, the area occupied by the epoxy in the interlayer space may correspond to 15% to 30% of the interlayer space, preferably 20% to 25%, and more preferably 23% to 25%. Further, although not shown, the thickness of an outer coating layer of the second magnetic body may be 10 μm to 40 μm, and preferably 20 μm to 30 μm. When the thickness is less than 10 μm, the strength may decrease, thus leading to damage to the metal ribbon. When the thickness is greater than 40 μm, the inductance reduction rate may increase, thus leading to deterioration in performance.

Figure 14:
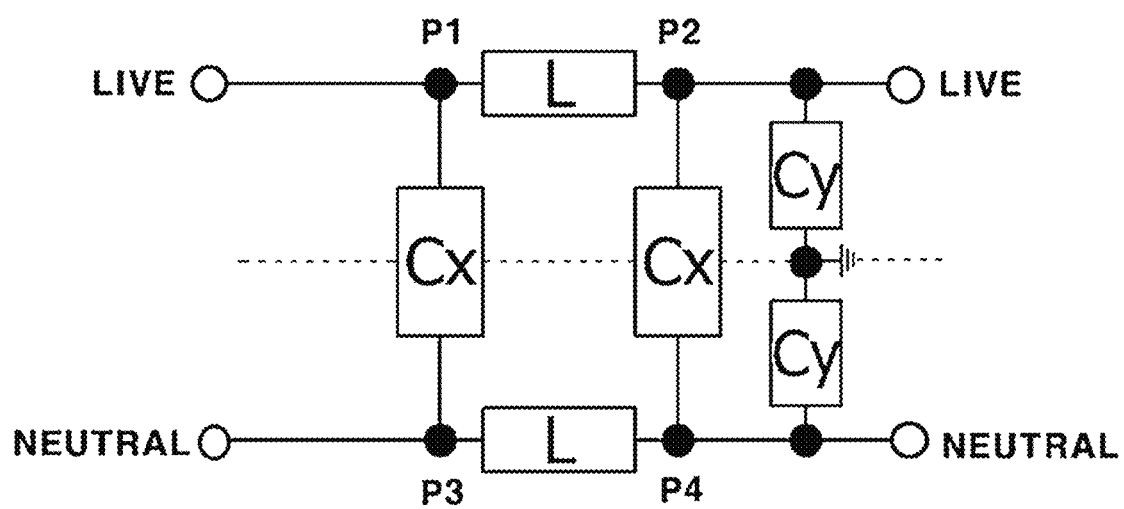
FIG. 14 is an example of an EMI filter including the inductor according to the embodiment.

Meanwhile, the inductor according to the above-described embodiment may be included in a line filter. For example, the line filter may be a line filter for reducing noise, which is applied to an AC-to-DC converter. FIG. 14 is an example of an EMI filter including the inductor according to the embodiment.

Referring to FIG. 14, an EMI filter 2000 may include a plurality of X-capacitors Cx, a plurality of Y-capacitors Cy, and an inductor L.

The X-capacitors Cx are respectively disposed between a first terminal P1 of a live line LIVE and a third terminal P3 of a neutral line NEUTRAL and between a second terminal P2 of the live line LIVE and a fourth terminal P4 of the neutral line NEUTRAL.

The plurality of Y-capacitors Cy may be disposed in series between the second terminal P2 of the live line LIVE and the fourth terminal P4 of the neutral line NEUTRAL.

The inductor L may be disposed between the first terminal P1 and the second terminal P2 of the live line LIVE and between the third terminal P3 and the fourth terminal P4 of the neutral line NEUTRAL. Here, the inductor L may be the inductor 100 according to the above-described embodiment.

When common-mode noise is introduced thereinto, the EMI filter 2000 removes the common-mode noise due to the combined impedance characteristics of the primary inductance and the Y-capacitor Cy. Here, the primary inductance of the live line LIVE may be obtained by measuring the inductance between the first and second terminals P1 and P2 in the state in which the third and fourth terminals P3 and P4 are open, and the primary inductance of the neutral line NEUTRAL may be obtained by measuring the inductance between the third and fourth terminals P3 and P4 in the state in which the first and second terminals P1 and P2 are open.

When differential-mode noise is introduced thereinto, the EMI filter 2000 removes the differential-mode noise due to the combined impedance characteristics of the leakage inductance and the X-capacitor Cx. Here, the leakage inductance of the live line LIVE may be obtained by measuring the inductance between the first and second terminals P1 and P2 in the state in which the third and fourth terminals P3 and P4 are short-circuited, and the leakage inductance of the neutral line NEUTRAL may be obtained by measuring the inductance between the third and fourth terminals P3 and P4 in the state in which the first and second terminals P1 and P2 are short-circuited.

The inductor of the EMI filter 2000 according to the embodiment corresponds to the inductor according to the above-described embodiments.

The contents of the above-described embodiments may be applied to other embodiments as long as they are not incompatible with one another.

While the present disclosure has been particularly shown and described with reference to exemplary embodiments thereof, these embodiments are only proposed for illustrative purposes and do not restrict the present disclosure, and it will be apparent to those skilled in the art that various changes in form and details may be made without departing from the essential characteristics of the embodiments set forth herein. For example, respective configurations set forth in the embodiments may be modified and applied. Further, differences in such modifications and applications should be construed as falling within the scope of the present disclosure as defined by the appended claims.

The invention claimed is:

1. A magnetic device comprising:
    a first magnetic member having a toroidal shape including an inner surface and an outer surface separated from the inner surface in a centrifugal direction;
    a second magnetic member disposed on the inner surface of the first magnetic member or the outer surface of the first magnetic member, the second magnetic member includes a plurality of layers in the centrifugal direction;
    a first resin member disposed between two adjacent ones of the plurality of layers of the second magnetic member;
    a second resin member disposed between another two adjacent ones of the plurality of layers of the second magnetic member;
    wherein the first resin member and the second resin member are separated from each other in the centrifugal direction,
    wherein a height distance of the first resin member in a vertical direction is different from a height distance of the second resin member in the vertical direction.

2. The magnetic device of claim 1, wherein the plurality of layers are arranged in consecutive order in the centrifugal direction, and the two adjacent ones of the layers are a first one and a second one of the layers in the consecutive order.

3. The magnetic device of claim 1,
    wherein the second magnetic member includes an outmost surface in the centrifugal direction, and
    the magnetic device comprises a third resin member disposed on the outmost surface of the second magnetic member.

4. The magnetic device of claim 1,
    wherein the second magnetic member includes an upper surface and a lower surface opposite to the upper surface, and
    the magnetic device comprises:
        a fourth resin member disposed on the upper surface of the second magnetic member, and
        a fifth resin member disposed on the lower surface of the second magnetic member.

5. The magnetic device of claim 4,
    wherein the third resin member is connected to the fourth resin member, and the third resin member is connected to the fifth resin member,
    wherein the first resin member includes epoxy material, the second resin member includes epoxy material, the third resin member includes epoxy material, the fourth resin member includes epoxy material, and the fifth resin member includes epoxy material.

6. The magnetic device of claim 3,
    wherein a thickness, in the centrifugal direction, of the third resin member is within a range of 10 μm to 40 μm.

7. The magnetic device of claim 4,
    wherein a separate gap is provided between each adjacent two of the plurality of layers of the second magnetic member, and each gap extends from the fourth resin member in the vertical direction,
    wherein the vertical direction is perpendicular to the centrifugal direction,
    wherein a ratio of a height distance, in the vertical direction, of the first resin member disposed in one of the gaps to a height distance, in the vertical direction of the second magnetic member is within a range of 0% to 5%.

8. The magnetic device of claim 7,
    wherein each of the gaps separately extends from the fifth resin member toward the fourth resin member, wherein a ratio of a height distance, in the vertical direction, of the second resin member disposed in one of the gaps to a height distance, in the vertical direction, of one of the layers of the second magnetic member is within a range of 0% to 5%.

9. The magnetic device of claim 1,
wherein the first magnetic member includes a manganese (Mn) material and a zinc (Zn) material,
wherein an inner surface of the first magnetic member forms a through-hole,
wherein the second magnetic member extends in a circumferential direction of the first magnetic member,
wherein the second magnetic member includes an iron (Fe) material and a silicon (Si) material.

10. The magnetic device of claim 9,
wherein the second magnetic member is wound, in the circumferential direction, around the first magnetic member at least 15 times,
wherein a total number of the plurality of layers of the second magnetic member is greater than 15.

11. The magnetic device of claim 10,
wherein the magnetic device is at least one of EMI (Electro-Magnetic Interference) filter, an Inductor, or a transformer.

12. A magnetic device comprising:
a toroidal shaped first magnetic member that includes an upper surface, a lower surface, an inner surface, an outer surface separated from the inner surface in a centrifugal direction, and a through-hole that passes through the upper surface and the lower surface, the through-hole formed by the inner surface of the first magnetic member;
a second magnetic member disposed on the outer surface of the first magnetic member;
wherein the second magnetic member includes a plurality of layers in the centrifugal direction, and a plurality of resin members, each of the resin members is separately disposed in the centrifugal direction between two adjacent layers of the second magnetic member,
wherein a first resin member of the plurality of resin members is disposed between two adjacent ones of the plurality of layers of the second magnetic member, a second resin member of the plurality of resin member is disposed between another two adjacent ones of the plurality of layers, and other resin members of the plurality of resin members are separately disposed between other two adjacent ones of the plurality of layers,
wherein a height distance of the first resin member in a vertical direction is different from a height distance of the second resin member in the vertical direction.

13. The magnetic device of claim 12,
wherein the plurality of layers are arranged in consecutive order in the centrifugal direction, and the two adjacent ones of the layers are a first one and a second one of the layers in the consecutive order, and the another two adjacent ones of the layers are the second one and a third one of the layers in the consecutive order.

14. The magnetic device of claim 12,
wherein the second magnetic member includes an outmost surface in the centrifugal direction,
wherein an outer resin member is disposed on the outmost surface of the second magnetic member.

15. The magnetic device of claim 14,
wherein a thickness, in the centrifugal direction, of the outer resin member is within a range of 10 μm to 40 μm.

16. The magnetic device of claim 12,
wherein each of the plurality of resin members separately includes a first portion extending from the upper surface of the first magnetic member toward the lower surface of the first magnetic member, and a second portion extending from the lower surface of the first magnetic member toward the upper surface of the first magnetic member,
wherein a ratio of a height distance of the first portion to a height distance of the first magnetic member is within a range of 0% to 5%,
wherein a ratio of a height distance of the second portion to the height distance of the first magnetic member is within a range of 0% to 5%.

17. The magnetic device of claim 12,
wherein the first magnetic member includes a manganese (Mn) material and a zinc (Zn) material,
wherein the second magnetic member includes an iron (Fe) material and a silicon (Si0 material,
wherein the second magnetic member extends in a circumferential direction of the first magnetic member,
wherein each of the plurality of resin members includes epoxy.

18. The magnetic device of claim 17,
wherein a height distance, in the vertical direction, of the first resin member is greater than a height distance, in the vertical direction, of the second resin member, and
wherein the height distance, in the vertical direction, of the second resin member is greater than a height distance, in the vertical direction, of the other resin members.

19. The magnetic device of claim 12,
wherein the magnetic device is at least one of an EMI (Electro-Magnetic Interference) filter, an Inductor, or a transformer.

20. A magnetic device comprising:
a first magnetic member having a toroidal shape including an inner surface and an outer surface separated from the inner surface in a centrifugal direction;
a second magnetic member disposed on the outer surface of the first magnetic member, the second magnetic member including a plurality of layers in the centrifugal direction;
a first resin member disposed between a first adjacent pair of the layers of the second magnetic member, and the first resin member to extend in a vertical direction from a bottom surface of the second magnetic member to a top portion of the first resin member; and
a second resin member disposed between a second adjacent pair of the layers of the second magnetic member, and the second resin member to extend in the vertical direction from the bottom surface of the second magnetic member to a top portion of the second resin member,
wherein a top height of the top portion of the first resin member is different from a top height of the top portion of the second resin member.

* * * * *